United States Patent
McCormack et al.

(10) Patent No.: US 9,559,790 B2
(45) Date of Patent: Jan. 31, 2017

(54) LINK EMISSION CONTROL

(71) Applicant: Keyssa, Inc., Campbell, CA (US)

(72) Inventors: Gary D. McCormack, Tigard, OR (US); Ian A. Kyles, West Linn, OR (US)

(73) Assignee: Keyssa, Inc., Campbell, CA (US)

( * ) Notice: Subject to any disclaimer, the term of this patent is extended or adjusted under 35 U.S.C. 154(b) by 552 days.

(21) Appl. No.: 13/754,694

(22) Filed: Jan. 30, 2013

(65) Prior Publication Data

US 2013/0196598 A1  Aug. 1, 2013

Related U.S. Application Data

(60) Provisional application No. 61/592,491, filed on Jan. 30, 2012.

(51) Int. Cl.
  G06K 19/06  (2006.01)
  H04B 15/00  (2006.01)
  (Continued)

(52) U.S. Cl.
  CPC ............... *H04B 15/00* (2013.01); *H01L 23/66* (2013.01); *H04B 5/00* (2013.01); *H04B 5/0031* (2013.01); *H01L 24/73* (2013.01); *H01L 2223/6677* (2013.01); *H01L 2224/16225* (2013.01); *H01L 2224/16245* (2013.01); *H01L 2224/32225* (2013.01); *H01L 2224/32245* (2013.01);
  (Continued)

(58) Field of Classification Search
  CPC .................................. G06K 7/0008; H04B 5/02
  See application file for complete search history.

(56) References Cited

U.S. PATENT DOCUMENTS

| 2,753,551 A | 7/1956 | Richmond |
| 3,796,831 A | 3/1974 | Bauer |

(Continued)

FOREIGN PATENT DOCUMENTS

| CN | 101212233 A | 7/2008 |
| CN | 101334470 A | 12/2008 |

(Continued)

OTHER PUBLICATIONS

L. L. Goldstone, "MM Wave Transmission Polarizer", International Symposium Digest—Antennas & Propagation vol. 2, Jun. 1979, 5 pages.

(Continued)

*Primary Examiner* — Thien M Le
*Assistant Examiner* — Asifa Habib
(74) *Attorney, Agent, or Firm* — Fenwick & West LLP

(57) ABSTRACT

Establishing a communication link may include transmitting by a first device an unmodulated first electromagnetic EHF signal and receiving by a second device the first electromagnetic EHF signal. The second device may determine whether the received first electromagnetic EHF signal indicates that a first shield portion and a second shield portion are in alignment. The transmission of a modulated second electromagnetic EHF signal may be enabled when the received first electromagnetic EHF signal indicates that both the shield portions are in alignment. The transmission of a modulated second signal may be disabled when the received first electromagnetic EHF signal indicates that the first and second shield portions are not in alignment.

10 Claims, 9 Drawing Sheets

(51) Int. Cl.
*H01L 23/66* (2006.01)
*H04B 5/00* (2006.01)
*H01L 23/00* (2006.01)

(52) U.S. Cl.
CPC .............. *H01L 2224/48227* (2013.01); *H01L 2224/48247* (2013.01); *H01L 2224/73265* (2013.01); *H01L 2924/15311* (2013.01); *H01L 2924/3011* (2013.01); *H01L 2924/3025* (2013.01)

(56) References Cited

U.S. PATENT DOCUMENTS

| | | | |
|---|---|---|---|
| 3,971,930 | A | 7/1976 | Fitzmaurice et al. |
| 4,485,312 | A | 11/1984 | Kusakabe et al. |
| 4,497,068 | A | 1/1985 | Fischer |
| 4,694,504 | A | 9/1987 | Porter et al. |
| 5,485,166 | A | 1/1996 | Verma et al. |
| 5,543,808 | A | 8/1996 | Feigenbaum et al. |
| 5,621,913 | A | 4/1997 | Tuttle et al. |
| 5,754,948 | A | 5/1998 | Metze |
| 5,773,878 | A | 6/1998 | Lim et al. |
| 5,921,783 | A | 7/1999 | Fritsch et al. |
| 5,941,729 | A | 8/1999 | Sri-Jayantha |
| 5,956,626 | A | 9/1999 | Kaschke et al. |
| 6,072,433 | A | 6/2000 | Young et al. |
| 6,252,767 | B1 | 6/2001 | Carlson |
| 6,351,237 | B1 | 2/2002 | Martek et al. |
| 6,490,443 | B1 | 12/2002 | Freeny, Jr. |
| 6,492,973 | B1 | 12/2002 | Kuroki et al. |
| 6,534,784 | B2 | 3/2003 | Eliasson et al. |
| 6,538,609 | B2 | 3/2003 | Nguyen et al. |
| 6,542,720 | B1 | 4/2003 | Tandy |
| 6,554,646 | B1 | 4/2003 | Casey |
| 6,590,544 | B1 | 7/2003 | Filipovic |
| 6,607,136 | B1 | 8/2003 | Atsmon et al. |
| 6,647,246 | B1 | 11/2003 | Lu |
| 6,718,163 | B2 | 4/2004 | Tandy |
| 6,915,529 | B1 | 7/2005 | Suematsu et al. |
| 6,967,347 | B2 | 11/2005 | Estes et al. |
| 7,107,019 | B2 | 9/2006 | Tandy |
| 7,213,766 | B2 | 5/2007 | Ryan et al. |
| 7,311,526 | B2 | 12/2007 | Rohrbach et al. |
| 7,512,395 | B2 | 3/2009 | Beukema et al. |
| 7,517,222 | B2 | 4/2009 | Rohrbach et al. |
| 7,593,708 | B2 | 9/2009 | Tandy |
| 7,598,923 | B2 | 10/2009 | Hardacker et al. |
| 7,599,427 | B2 * | 10/2009 | Bik .................. 375/219 |
| 7,612,630 | B2 | 11/2009 | Miller |
| 7,617,342 | B2 | 11/2009 | Rofougaran |
| 7,645,143 | B2 | 1/2010 | Rohrbach et al. |
| 7,656,205 | B2 | 2/2010 | Chen et al. |
| 7,664,461 | B2 | 2/2010 | Rofougaran et al. |
| 7,759,700 | B2 | 7/2010 | Ueno et al. |
| 7,760,045 | B2 | 7/2010 | Kawasaki |
| 7,761,092 | B2 | 7/2010 | Desch et al. |
| 7,768,457 | B2 | 8/2010 | Pettus et al. |
| 7,769,347 | B2 | 8/2010 | Louberg et al. |
| 7,778,621 | B2 | 8/2010 | Tandy |
| 7,791,167 | B1 | 9/2010 | Rofougaran |
| 7,820,990 | B2 | 10/2010 | Schroeder et al. |
| 7,889,022 | B2 | 2/2011 | Miller |
| 7,907,924 | B2 | 3/2011 | Kawasaki |
| 7,929,474 | B2 | 4/2011 | Pettus et al. |
| 7,974,587 | B2 | 7/2011 | Rofougaran |
| 8,014,416 | B2 | 9/2011 | Ho et al. |
| 8,036,629 | B2 | 10/2011 | Tandy |
| 8,041,227 | B2 | 10/2011 | Holcombe et al. |
| 8,063,769 | B2 | 11/2011 | Rofougaran |
| 8,081,699 | B2 | 12/2011 | Siwiak et al. |
| 8,087,939 | B2 | 1/2012 | Rohrbach et al. |
| 8,121,542 | B2 | 2/2012 | Zack et al. |
| 8,131,645 | B2 | 3/2012 | Lin et al. |
| 8,183,935 | B2 | 5/2012 | Milano et al. |
| 8,244,179 | B2 | 8/2012 | Dua |
| 8,244,189 | B2 | 8/2012 | Rofougaran et al. |
| 8,279,611 | B2 | 10/2012 | Wong et al. |
| 8,339,258 | B2 | 12/2012 | Rofougaran |
| 9,225,120 | B2 | 12/2015 | Barr |
| 2002/0106041 | A1 | 8/2002 | Chang et al. |
| 2004/0020674 | A1 | 2/2004 | McFadden et al. |
| 2004/0113857 | A1 | 6/2004 | Gerhard |
| 2004/0214621 | A1 | 10/2004 | Ponce De Leon et al. |
| 2005/0109841 | A1 | 5/2005 | Ryan et al. |
| 2005/0140436 | A1 | 6/2005 | Ichitsubo et al. |
| 2006/0038168 | A1 | 2/2006 | Estes et al. |
| 2006/0051981 | A1 | 3/2006 | Neidlein et al. |
| 2006/0082518 | A1 | 4/2006 | Ram |
| 2006/0128372 | A1 | 6/2006 | Gazzola |
| 2006/0159158 | A1 | 7/2006 | Moore et al. |
| 2006/0250250 | A1 | 11/2006 | Youn |
| 2006/0258289 | A1 | 11/2006 | Dua |
| 2007/0024504 | A1 | 2/2007 | Matsunaga |
| 2007/0035917 | A1 | 2/2007 | Hotelling et al. |
| 2007/0063056 | A1 | 3/2007 | Gaucher et al. |
| 2007/0147425 | A1 | 6/2007 | Lamoureux et al. |
| 2007/0229270 | A1 | 10/2007 | Rofougaran |
| 2007/0278632 | A1 | 12/2007 | Zhao et al. |
| 2008/0002652 | A1 | 1/2008 | Gupta et al. |
| 2008/0055093 | A1 | 3/2008 | Shkolnikov et al. |
| 2008/0089667 | A1 | 4/2008 | Grady et al. |
| 2008/0112101 | A1 | 5/2008 | McElwee et al. |
| 2008/0150799 | A1 | 6/2008 | Hemmi et al. |
| 2008/0150821 | A1 | 6/2008 | Koch et al. |
| 2008/0159243 | A1 | 7/2008 | Rofougaran |
| 2008/0165002 | A1 | 7/2008 | Tsuji |
| 2008/0192726 | A1 | 8/2008 | Mahesh et al. |
| 2008/0195788 | A1 | 8/2008 | Tamir et al. |
| 2008/0197973 | A1 | 8/2008 | Enguent |
| 2008/0290959 | A1 | 11/2008 | Ali et al. |
| 2008/0293446 | A1 | 11/2008 | Rofougaran |
| 2009/0006677 | A1 | 1/2009 | Rofougaran |
| 2009/0008753 | A1 | 1/2009 | Rofougaran |
| 2009/0009337 | A1 | 1/2009 | Rofougaran |
| 2009/0010316 | A1 | 1/2009 | Rofougaran |
| 2009/0037628 | A1 | 2/2009 | Rofougaran |
| 2009/0075688 | A1 | 3/2009 | Rofougaran |
| 2009/0094506 | A1 | 4/2009 | Lakkis |
| 2009/0098826 | A1 | 4/2009 | Zack et al. |
| 2009/0111315 | A1 | 4/2009 | Kato et al. |
| 2009/0111390 | A1 | 4/2009 | Sutton et al. |
| 2009/0175323 | A1 | 7/2009 | Chung |
| 2009/0218407 | A1 * | 9/2009 | Rofougaran .................. 235/492 |
| 2009/0218701 | A1 | 9/2009 | Rofougaran |
| 2009/0236701 | A1 | 9/2009 | Sun et al. |
| 2009/0239392 | A1 | 9/2009 | Sumitomo et al. |
| 2009/0239483 | A1 | 9/2009 | Rofougaran |
| 2009/0245808 | A1 | 10/2009 | Rofougaran |
| 2009/0280765 | A1 | 11/2009 | Rofougaran et al. |
| 2010/0009627 | A1 | 1/2010 | Huomo |
| 2010/0120406 | A1 | 5/2010 | Banga et al. |
| 2010/0127804 | A1 | 5/2010 | Vouloumanos |
| 2010/0149149 | A1 | 6/2010 | Lawther |
| 2010/0159829 | A1 | 6/2010 | McCormack |
| 2010/0167645 | A1 | 7/2010 | Kawashimo |
| 2010/0202499 | A1 | 8/2010 | Lee et al. |
| 2010/0203833 | A1 | 8/2010 | Dorsey |
| 2010/0231452 | A1 | 9/2010 | Babakhani et al. |
| 2010/0265648 | A1 | 10/2010 | Hirabayashi |
| 2010/0277394 | A1 | 11/2010 | Haustein et al. |
| 2010/0283700 | A1 | 11/2010 | Rajanish et al. |
| 2010/0285634 | A1 | 11/2010 | Rofougaran |
| 2010/0296252 | A1 | 11/2010 | Rollin et al. |
| 2010/0297954 | A1 | 11/2010 | Rofougaran et al. |
| 2010/0315954 | A1 | 12/2010 | Singh et al. |
| 2011/0038282 | A1 | 2/2011 | Mihota et al. |
| 2011/0040909 | A1 | 2/2011 | Abdulla |
| 2011/0044404 | A1 | 2/2011 | Vromans |
| 2011/0047588 | A1 | 2/2011 | Takeuchi et al. |
| 2011/0057291 | A1 | 3/2011 | Slupsky et al. |
| 2011/0090030 | A1 | 4/2011 | Pagani |
| 2011/0092212 | A1 | 4/2011 | Kubota |
| 2011/0127844 | A1 | 6/2011 | Walley et al. |
| 2011/0127954 | A1 | 6/2011 | Walley et al. |

(56) References Cited

U.S. PATENT DOCUMENTS

| | | |
|---|---|---|
| 2011/0181484 A1 | 7/2011 | Pettus et al. |
| 2011/0191480 A1 | 8/2011 | Kobayashi |
| 2011/0197237 A1 | 8/2011 | Turner |
| 2011/0207425 A1 | 8/2011 | Juntunen et al. |
| 2011/0285606 A1 | 11/2011 | De Graauw et al. |
| 2011/0286703 A1 | 11/2011 | Kishima et al. |
| 2011/0311231 A1 | 12/2011 | Ridgway et al. |
| 2012/0009880 A1 | 1/2012 | Trainin et al. |
| 2012/0028582 A1 | 2/2012 | Tandy |
| 2012/0064664 A1 | 3/2012 | Yamazaki et al. |
| 2012/0069772 A1 | 3/2012 | Byrne et al. |
| 2012/0072620 A1 | 3/2012 | Jeong et al. |
| 2012/0082194 A1 | 4/2012 | Tam et al. |
| 2012/0083137 A1 | 4/2012 | Rohrbach et al. |
| 2012/0091799 A1 | 4/2012 | Rofougaran et al. |
| 2012/0110635 A1 | 5/2012 | Harvey et al. |
| 2012/0263244 A1 | 10/2012 | Kyles et al. |
| 2012/0286049 A1 | 11/2012 | McCormack et al. |
| 2012/0290760 A1 | 11/2012 | McCormack et al. |
| 2012/0295539 A1 | 11/2012 | McCormack et al. |
| 2012/0307932 A1 | 12/2012 | McCormack et al. |
| 2012/0319496 A1 | 12/2012 | McCormack et al. |
| 2012/0319890 A1 | 12/2012 | McCormack et al. |
| 2013/0070817 A1 | 3/2013 | McCormack et al. |
| 2013/0106673 A1 | 5/2013 | McCormack et al. |
| 2013/0109303 A1 | 5/2013 | McCormack et al. |
| 2013/0157477 A1 | 6/2013 | McCormack |
| 2013/0183903 A1 | 7/2013 | McCormack et al. |
| 2013/0278360 A1 | 10/2013 | Kim et al. |
| 2014/0043208 A1 | 2/2014 | McCormack et al. |

FOREIGN PATENT DOCUMENTS

| | | |
|---|---|---|
| CN | 101919052 A | 12/2010 |
| CN | 101997150 A | 3/2011 |
| CN | 102024290 A | 4/2011 |
| EP | 0 515 187 A2 | 11/1992 |
| EP | 0515187 A2 | 11/1992 |
| EP | 1 298 809 A2 | 4/2003 |
| EP | 1298809 A2 | 4/2003 |
| EP | 1798867 A2 | 6/2007 |
| EP | 2106192 A2 | 9/2009 |
| EP | 2 309 608 A1 | 4/2011 |
| EP | 2309608 A1 | 4/2011 |
| EP | 2328226 A1 | 6/2011 |
| EP | 2 360 923 A1 | 8/2011 |
| EP | 2360923 A1 | 8/2011 |
| GB | 817349 | 7/1959 |
| JP | 2003209511 | 7/2003 |
| JP | 2003209511 A | 7/2003 |
| JP | 2008-530844 A | 8/2008 |
| JP | 2009-099280 A | 5/2009 |
| JP | 2011-022640 A | 2/2011 |
| JP | 2011-041078 A | 2/2011 |
| WO | 97/32413 A1 | 9/1997 |
| WO | WO 97/32413 A1 | 9/1997 |
| WO | WO 2010/124165 A1 | 10/2010 |
| WO | WO 2011/019017 A1 | 2/2011 |
| WO | 2011/114737 A1 | 9/2011 |
| WO | 2011/114738 A1 | 9/2011 |
| WO | WO 2011/114737 A1 | 9/2011 |
| WO | WO 2011/114738 A1 | 9/2011 |
| WO | 2012/129426 A3 | 9/2012 |
| WO | WO 2012/129426 A3 | 9/2012 |
| WO | 2012/155135 A3 | 11/2012 |
| WO | WO 2012/155135 A3 | 11/2012 |
| WO | 2012/166922 A1 | 12/2012 |
| WO | 2012/174350 A1 | 12/2012 |
| WO | WO 2012/166922 A1 | 12/2012 |
| WO | WO 2012/174350 A1 | 12/2012 |
| WO | 2013/006641 A3 | 1/2013 |
| WO | WO 2013/006641 A3 | 1/2013 |
| WO | 2013/040396 A1 | 3/2013 |
| WO | WO 2013/040396 A3 | 3/2013 |
| WO | 2013/059801 A1 | 4/2013 |
| WO | 2013/059802 A1 | 4/2013 |
| WO | WO 2013/059801 A1 | 4/2013 |
| WO | WO 2013/059802 A1 | 4/2013 |
| WO | 2013/090625 A1 | 6/2013 |
| WO | WO 2013/090625 A1 | 6/2013 |
| WO | WO 2013/162844 A1 | 10/2013 |

OTHER PUBLICATIONS

ECMA International, "Standard ECMA-398: Close Proximity Electric Induction Wireless Communications", Internet citation, Jun. 1, 2011, pp. 1-99.

Jochen Helms, Authorized Officer, European Patent Office, "International Search Report" in connection with related PCT Patent Application No. PCT/US2013/023886, dated Jul. 25, 2013, 7 pages.

Jochen Helms, Authorized Officer, European Patent Office, "Written Opinion of the International Searching Authority" in connection with related PCT Patent Application No. PCT/US2013/023886, dated Jul. 25, 2013, 11 pages.

Office of Engineering and Technology Federal Communications Commission, "Understanding the FCC Regulations for Low-Power, Non-Licensed Transmitters", OET Bulletin No. 63, Oct. 1993, 34 pages.

Vahle Electrification Systems, "CPS Contactless Power System", Catalog No. 9d/E, 2004, 12 pages.

Future Technology Devices International Limited (FTDI), "Technical Note TN_113 Simplified Description of USB Device Enumeration", Doc. Ref. No. FT_000180, Version 1.0, Issue Date Oct. 28, 2009, 19 pages.

Lee W. Young, Authorized Officer, U.S. Patent and Trademark Office, "International Search Report" in connection with related PCT Patent App. No. PCT/US2013/027835, dated May 3, 2013, 4 pages.

Lee W. Young, Authorized Officer, U.S. Patent and Trademark Office, "Written Opinion of the International Searching Authority" in connection with related PCT Patent App. No. PCT/US2013/027835, dated May 3, 2013, 8 pages.

Márquez, T. López, Authorized Officer, European Patent Office, "International Search Report" in connection with related PCT Patent App. No. PCT/US2013/029469, dated Jun. 6, 2013, 5 pages.

Márquez, T. López, Authorized Officer, European Patent Office, "Written Opinion of the International Searching Authority" in connection with related PCT Patent App. No. PCT/US2013/029469, dated Jun. 6, 2013, 5 pages.

Jochen Helms, Authorized Officer, European Patent Office, "International Search Report" in connection with related PCT Patent App. No. PCT/US2013/023665, dated Jun. 20, 2013, 5 pages.

Jochen Helms, Authorized Officer, European Patent Office, "Written Opinion of the International Searching Authority" in connection with related PCT Patent App. No. PCT/US2013/023665, dated Jun. 20, 2013, 10 pages.

Eric A. Juntunen, "60 GHz CMOS Pico-Joule/Bit Oook Receiver Design for Multi-Gigabit Per Second Wireless Communications" thesis paper, Aug. 2008, 52 pages.

Murcia Martinez, J., Authorized Officer, European Patent Office, "International Search Report" in connection with related Application Serial No. PCT/US2012/040214, dated Aug. 21, 2012, 3 pages.

Murcia Martinez, J., Authorized Officer, European Patent Office, "Written Opinion of the International Searching Authority" in connection with related Application Serial No. PCT/US2012/040214, dated Aug. 21, 2012, 8 pages.

Ablerga, Vito, Authorized Officer, European Patent Office, "International Search Report" in connection with related Application Serial No. PCT/US2012/042616,, dated Oct. 1, 2012, 4 pages.

Ablerga, Vito, Authorized Officer, European Patent Office, "Written Opinion of the International Searching Authority" in connection with related Application Serial No. PCT/US2012/042616,, dated Oct. 1, 2012, 10 pages.

Cortes Rosa, Joao, Authorized Officer, European Patent Office, "International Search Report" in connection with related Application No. PCT/US2012/030166, dated Oct. 31, 2010, 6 pages.

(56) References Cited

OTHER PUBLICATIONS

Cortes Rosa, Joao, Authorized Officer, European Patent Office, "Written Opinion of the International Searching Authority" in connection with related Application No. PCT/US2012/030166, dated Oct. 31, 2010, 9 pages.
Helms, Jochen, Authorized Officer, European Patent Office, "International Search Report" in connection with related Application No. PCT/US2012/055488, dated Dec. 13, 2012, 4 pages.
Helms, Jochen, Authorized Officer, European Patent Office, "Written Opinion of the International Searching Authority" in connection with related Application No. PCT/US2012/055488, dated Dec. 13, 2012, 8 pages.
Helms, Jochen, Authorized Officer, European Patent Office, "International Search Report" in connection with related Application No. PCT/US2012/045444, dated Jan. 21, 2013, 7 pages.
Helms, Jochen, Authorized Officer, European Patent Office, "Written Opinion of the International Searching Authority" in connection with related Application No. PCT/US2012/045444, dated Jan. 21, 2013, 9 pages.
Helms, Jochen, Authorized Officer, European Patent Office, "International Search Report" in connection with related Application No. PCT/US2012/037795, dated Jan. 21, 2013, 7 pages.
Helms, Jochen, Authorized Officer, European Patent Office, "Written Opinion of the International Searching Authority" in connection with related Application No. PCT/US2012/037795, dated Jan. 21, 2013, 12 pages.
Helms, Jochen, Authorized Officer, European Patent Office, "International Search Report" in connection with related Application No. PCT/US2012/061345, dated Jan. 24, 2013, 4 pages.
Helms, Jochen, Authorized Officer, European Patent Office, "Written Opinion of the International Searching Authority" in connection with related Application No. PCT/US2012/061345, dated Jan. 24, 2013, 7 pages.
Franz, Volker, Authorized Officer, European Patent Office, "International Search Report" in connection with related Application No. PCT/US2012/061346, dated Jan. 24, 2013, 5 pages.
Franz, Volker, Authorized Officer, European Patent Office, "Witten Opinion of the International Searching Authority" in connection with related Application No. PCT/US2012/061346, dated Jan. 24, 2013, 9 pages.
Bouhana, Emmanuel, Authorized Officer, European Patent Office, "International Search Report" in connection with related Application No. PCT/US2012/069576, dated May 2, 2013, 3 pages.
Bouhana, Emmanuel, Authorized Officer, European Patent Office, "Written Opinion of the International Searching Authority" in connection with related Application No. PCT/US2012/069576, dated May 2, 2013, 13 pages.
Chinese Office Action, Chinese Application No. 201280034365.5, Nov. 3, 2014 (with Detailed Summary), 14 pages.
ECMA International, "Standard ECMA-398: Close Proximity Electric Induction Wireless Communications", Internet citation, Jun. 1, 2011, pp. 1-98.
Future Technology Devices International Limited (FTDI), "Technical Note TN.sub.—113 Simplified Description of USB Device Enumeration", Doc. Ref. No. FT.sub.—000180, Version 1.0, Issue Date Oct. 28, 2009, 19 pages.
Goldstone, L.L. "MM Wave Transmission Polarizer", International Symposium Digest—Antennas & Propagation vol. 2, Jun. 1979, 5 pages.
Japanese Office Action, Japanese Application No. 2014-510541, Nov. 4, 2014, 22 pages.
Juntunen, Eric A. , "60 GHz CMOS Pico-Joule/Bit Oook Receiver Design for Multi-Gigabit Per Second Wireless Communications" thesis paper, Aug. 2008, 52 pages.
PCT International Search Report, PCT Application No. PCT/US2013/029469, Jun. 6, 2013, 5 pages.
PCT Written Opinion, PCT Application No. PCT/US2013/029469, Jun. 6, 2013, 5 pages.
PCT International Search Report, PCT Application No. PCT/US2013/023665, Jun. 20, 2013, 5 pages.
PCT Written Opinion, PCT Application No. PCT/US2013/023665, Jun. 20, 2013, 10 pages.
PCT International Search Report, PCT Application No. PCT/US2012/040214, Aug. 21, 2012, 3 pages.
PCT Written Opinion, PCT Application No. PCT/US2012/040214, Aug. 21, 2012, 8 pages.
PCT International Search Report, PCT Application No. PCT/US2012/042616, Oct. 1, 2012, 4 pages.
PCT Written Opinion, PCT Application No. PCT/US2012/042616, Oct. 1, 2012, 10 pages.
PCT International Search Report, PCT Application No. PCT/US2012/030166, Oct. 31, 2010, 6 pages.
PCT Written Opinion, PCT Application No. PCT/US2012/030166, Oct. 31, 2010, 9 pages.
PCT International Search Report, PCT Application No. PCT/US2012/055488, Dec. 13, 2012, 4 pages.
PCT Written Opinion, PCT Application No. PCT/US2012/055488, Dec. 13, 2012, 8 pages.
PCT International Search Report, PCT Application No. PCT/US2012/045444, Jan. 21, 2013, 7 pages.
PCT Written Opinion, PCT Application No. PCT/US2012/045444, Jan. 21, 2013, 9 pages.
PCT International Search Report, PCT Application No. PCT/US2012/037795, Jan. 21, 2013, 7 pages.
PCT Written Opinion, PCT Application No. PCT/US2012/037795, Jan. 21, 2013, 12 pages.
PCT International Search Report, PCT Application No. PCT/US2012/061345, Jan. 24, 2013, 4 pages.
PCT Written Opinion, PCT Application No. PCT/US2012/061345, Jan. 24, 2013, 7 pages.
PCT International Search Report, PCT Application No. PCT/US2012/061346, Jan. 24, 2013, 5 pages.
PCT Written Opinion, PCT Application No. PCT/US2012/061346, Jan. 24, 2013, 9 pages.
PCT International Search Report, PCT Application No. PCT/US2012/069576, May 2, 2013, 3 pages.
PCT Written Opinion, PCT Application No. PCT/US2012/069576, May 2, 2013, 13 pages.
PCT International Search Report, PCT Application No. PCT/US2013/027835, May 3, 2013, 4 pages.
PCT Written Opinion, PCT Application No. PCT/US2013/027835, May 3, 2013, 4 pages.
PCT International Search Report, PCT Application No. PCT/US2013/023886, Jul. 25, 2013, 7 pages.
PCT Written Opinion, PCT Application No. PCT/US2013/023886, Jul. 25, 2013, 11 pages.
PCT Invitation to Pay Additional Fees, PCT Application No. PCT/US2013/023886, May 3, 2013, 7 pages.
"WirelessHD Specification version 1.1 Overview", www.wirelesshd.org, May 2010, 95 pages.
United States Office Action, U.S. Appl. No. 13/471,052, Sep. 11, 2013, 15 pages.
United States Office Action, U.S. Appl. No. 13/471,052, Feb. 14, 2013, 13 pages.
United States Office Action, U.S. Appl. No. 13/618,138, Jun. 26, 2014, 9 pages.
United States Office Action, U.S. Appl. No. 13/657,476, Jan. 20, 2015, 12 pages.
United States Office Action, U.S. Appl. No. 13/657,476, Sep. 8, 2014, 19 pages.
United States Office Action, U.S. Appl. No. 13/471,058, Jul. 31, 2014, 9 pages.
United States Office Action, U.S. Appl. No. 13/471,058, Feb. 27, 2015, 9 pages.
United States Office Action, U.S. Appl. No. 13/784,581, Oct. 11, 2013, 15 pages.
United States Office Action, U.S. Appl. No. 13/784,581, May 24, 2013, 10 pages.
Chinese First Office Action, Chinese Application No. 201280054333.1, Mar. 31, 2015, 12 pages.
Chinese First Office Action, Chinese Application No. 201380015101.X, May 6, 2015, 19 pages.

(56) References Cited

OTHER PUBLICATIONS

Chinese First Office Action, Chinese Application No. 201280051487.5, Jun. 3, 2015, 14 pages.
Chinese Second Office Action, Chinese Application No. 201280034365.5, Jun. 26, 2015, 7 pages (with English Summary of Office Action Objections).
Chinese Second Office Action, Chinese Application No. 201280054333.1, Nov. 23, 2015, 6 pages.
Chinese Third Office Action, Chinese Application No. 201280034365.5, Nov. 24, 2015, 7 pages.
Chinese Second Office Action, Chinese Application No. 201380015101X, Jan. 20, 2016, 4 pages.
Chinese Second Office Action, Chinese Application No. 201280051487.5, Jan. 14, 2016, 14 pages.
Chinese Third Office Action, Chinese Application No. 201280054333.1, May 10, 2016, 4 pages (with concise explanation of relevance).
Chinese Third Office Action, Chinese Application No. 201380015101.X, Jun. 8, 2016, 7 pages.
Japanese Office Action, Japanese Application No. 2014-530867, May 1, 2015, 11 pages.
Japanese Office Action, Japanese Application No. 2014-510541, Jul. 17, 2015, 13 pages.
PCT International Search Report, PCT Application No. PCT/US14/12716, Mar. 13, 2015, 4 pages.
PCT Written Opinion, PCT Application No. PCT/US14/12716, Mar. 13, 2015, 6 pages.
Taiwan Office Action, Taiwan Application No. 101133650, Apr. 12, 2016, 5 pages.
Taiwan Office Action, Taiwan Application No. 12103464, May 9, 2016, 16 pages.
United States Office Action, U.S. Appl. No. 13/657,476, Jun. 4, 2015, 15 pages.
United States Office Action, U.S. Appl. No. 14/137,939, Aug. 17, 2015, 8 pages.
United States Office Action, U.S. Appl. No. 14/533,545, Oct. 9, 2015, 10 pages.
United States Office Action, U.S. Appl. No. 13/471,058, Mar. 10, 2016, 10 pages.
United States Office Action, U.S. Appl. No. 13/657,476, Jun. 22, 2016, 20 pages.
Taiwan Office Action, Taiwan Application No. 102103464, Nov. 10, 2016, 12 pages.

* cited by examiner

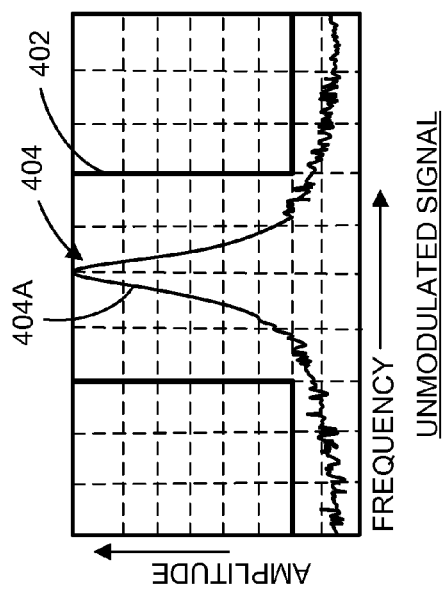
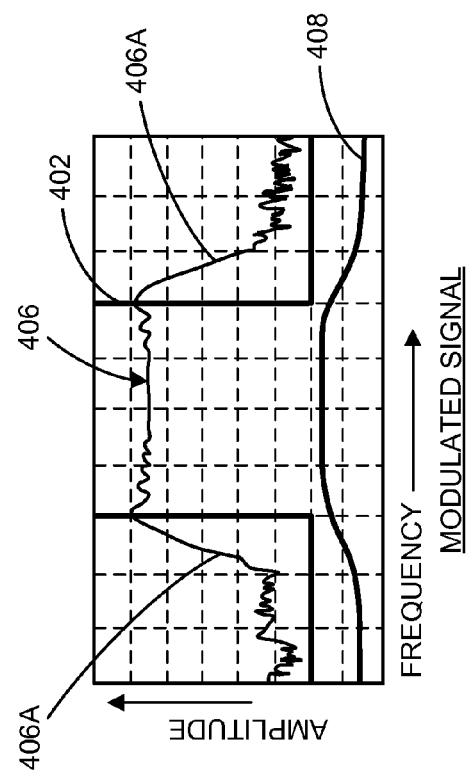

1

LINK EMISSION CONTROL

RELATED APPLICATION

This application claims the benefit of U.S. Provisional Patent Application No. 61/592,491 filed Jan. 30, 2012, which application is incorporated herein by reference for all purposes.

FIELD OF THE INVENTION

The present disclosure relates to connectors for electronic devices and more specifically to systems and methods for controlling electromagnetic emissions in connectors connecting the electronic devices.

BACKGROUND

Advances in semiconductor manufacturing and circuit design technologies have enabled the development and production of integrated circuits (ICs) with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

Many electronic systems include multiple printed circuit boards (PCBs) upon which these high-speed ICs are mounted, and through which various signals are routed to and from the ICs. In electronic systems with at least two PCBs and the need to communicate information between those PCBs, a variety of connector and backplane architectures have been developed to facilitate information flow between the boards. Such connector and backplane architectures introduce unwanted electromagnetic signal emissions that may interfere with other circuits and devices. When wireless communication links are used, excessive electromagnetic emissions may occur prior to as well as during interconnection between two circuits or devices.

BRIEF SUMMARY

An embodiment of a method for managing a communication link between a first device and a second device in which the first device may have a first shield portion and the second device may have a second shield portion, may include receiving by the second device a first electromagnetic EHF signal transmitted by the first device. The second device may determine whether the received first electromagnetic EHF signal indicates that the first shield portion of the first device and the second shield portion of the second device are in alignment. In response to a determination that the received first electromagnetic EHF signal indicates that the first shield portion and the second shield portion are in alignment, the second device may enable transmission of a modulated second electromagnetic EHF signal by the second device.

An embodiment of a method for managing a communication link between a first device and a second device in which the first device may have a first shield portion and the second device may have a second shield portion, may include receiving by the second device a first electromagnetic EHF signal transmitted by the first device. The second device may determine whether the received first electromagnetic EHF signal indicates that the first shield portion of the first device and the second shield portion of the second device are in alignment. In response to a determination that the received first electromagnetic EHF signal indicates that the first shield portion and the second shield portion are not in alignment, the second device may disable transmission of a modulated second electromagnetic EHF signal by the second device.

An embodiment of a method for managing a communication link between a first device and a second device may include receiving by near field coupling to the second device, a first electromagnetic EHF signal transmitted by the first device. The second device may determine whether the received first electromagnetic EHF signal indicates that the first device is an acceptable device for communication with the second device. In response to a determination that the first device is an acceptable device, the second device may enable transmission by near field coupling of a modulated second electromagnetic EHF signal by the second device.

An embodiment of a method for managing a communication link may include transmitting by near field coupling from a first device, a first electromagnetic EHF signal that is low-level modulated with a predefined code required by a corresponding second device. The first device may receive by near field coupling to the first device a second electromagnetic EHF signal transmitted by the second device. The first device may determine whether the received second electromagnetic EHF signal is modulated with a high level of modulation. In response to a determination that the received second electromagnetic EHF signal is modulated with a high level of modulation, the first device may enable transmitting the first electromagnetic EHF signal with a high level of modulation.

An embodiment of a second device for use in a communication link with a first device, the first device having a first shield portion, may include a first EHF communication unit configured to receive a first electromagnetic EHF signal transmitted by the first device. A second shield portion may provide partial shielding for the EHF communication unit. A first signal controller may be coupled to the first EHF communication unit and be configured to determine whether the received first electromagnetic EHF signal indicates that the first shield portion of the first device and the second shield portion of the second device are in alignment. In response to a determination that the received first electromagnetic EHF signal indicates that the first shield portion and the second shield portion are in alignment, the first signal controller may enable transmission of a modulated second electromagnetic EHF signal by the EHF communication unit.

An embodiment of a second device for use in a communication link with a first device, may include a first EHF communication unit configured to receive by near field coupling a first electromagnetic EHF signal transmitted by the first device. A first signal controller may be coupled to the EHF communication unit and may be configured to determine whether the received first electromagnetic EHF signal indicates that the first device is an acceptable device for communication with the second device. In response to a determination that the first device is an acceptable device for communication with the second device, enabling transmission by near field coupling of a modulated second electromagnetic EHF signal by the EHF communication unit.

In some examples, a method for establishing a communication link may include transmitting by a first device a first electromagnetic EHF signal low-level modulated with a predefined code required by a corresponding second device, and receiving by the first device a second electromagnetic EHF signal transmitted by the second device. The first device may determine whether the received second electromagnetic EHF signal is modulated with a high level of modulation. If the received electromagnetic EHF signal is modulated with a high level of modulation, transmission of the low-level modulated first electromagnetic EHF signal may be terminated. The first electromagnetic EHF signal may then be transmitted with a high level of modulation.

In some examples, a first device for use in a system having first and second devices for establishing a communication link between the first and second devices may include a first EHF communication unit configured to transmit to the second device a first electromagnetic EHF signal low-level modulated with a predefined code required by a corresponding second device. A second EHF communication unit may be configured to receive a second electromagnetic EHF signal transmitted by the second device. A signal controller may be configured to determine whether the received second electromagnetic EHF signal is modulated with a high level of modulation. If the received second electromagnetic EHF signal is modulated with a high level of modulation, transmission of the low-level modulated first electromagnetic EHF signal by the first EHF communication unit may be disabled, and transmission of the first electromagnetic EHF signal with a high level of modulation may be enabled.

BRIEF DESCRIPTION OF THE SEVERAL VIEWS OF THE DRAWINGS

Figure 1:
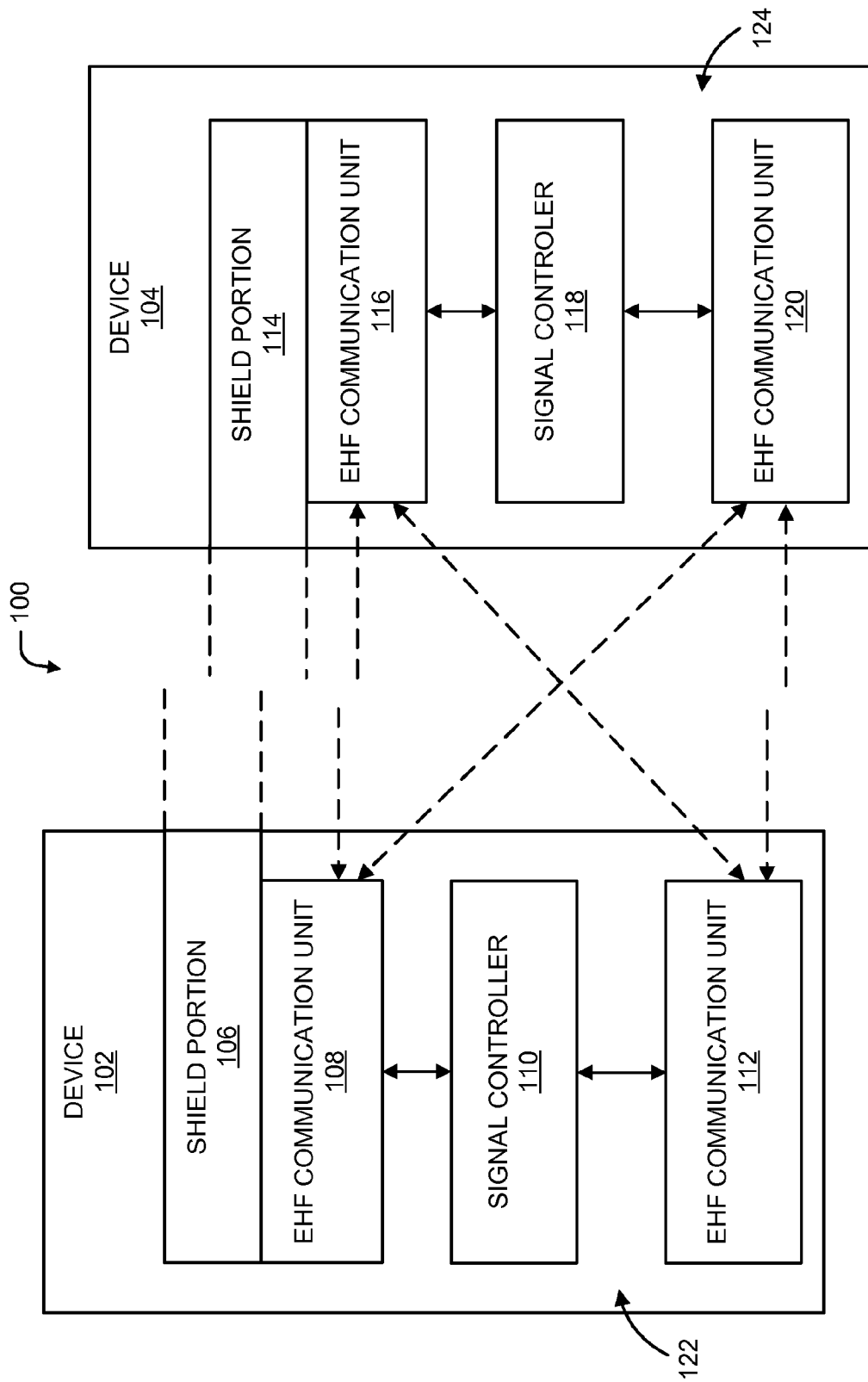
Figure 2:
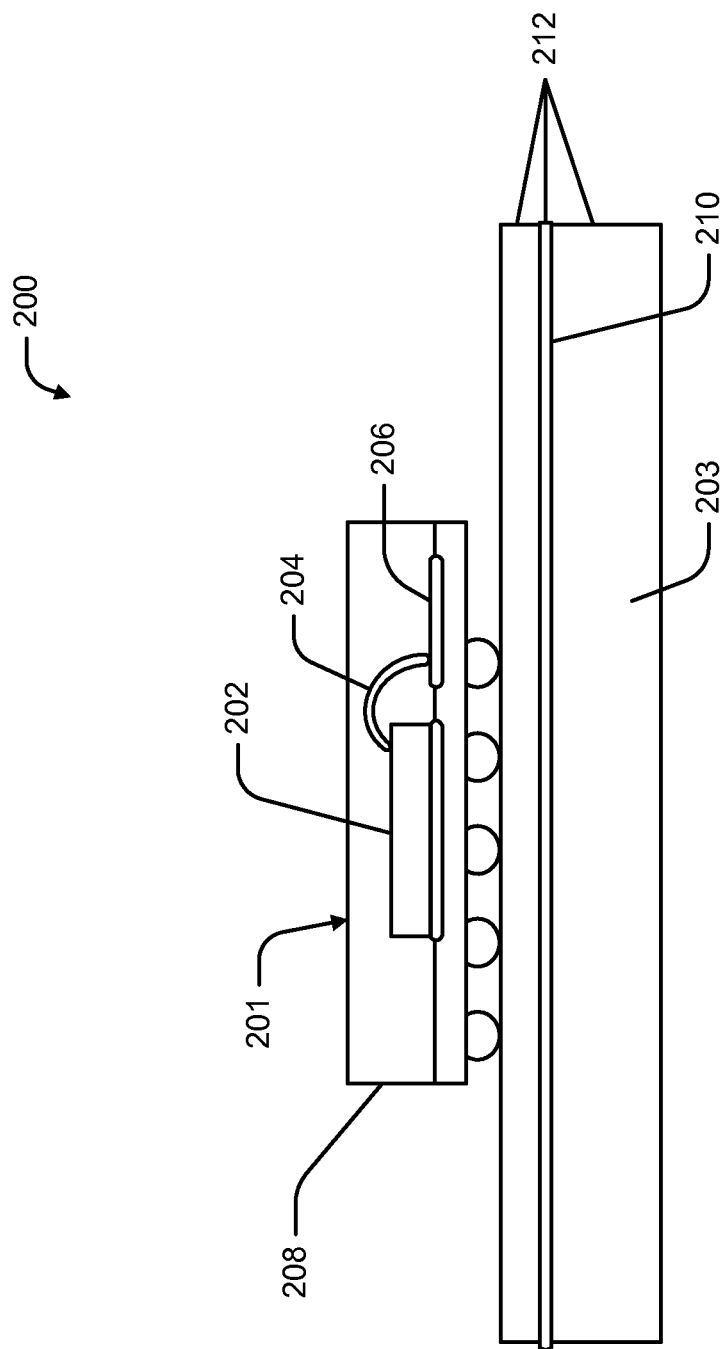
Figure 3:
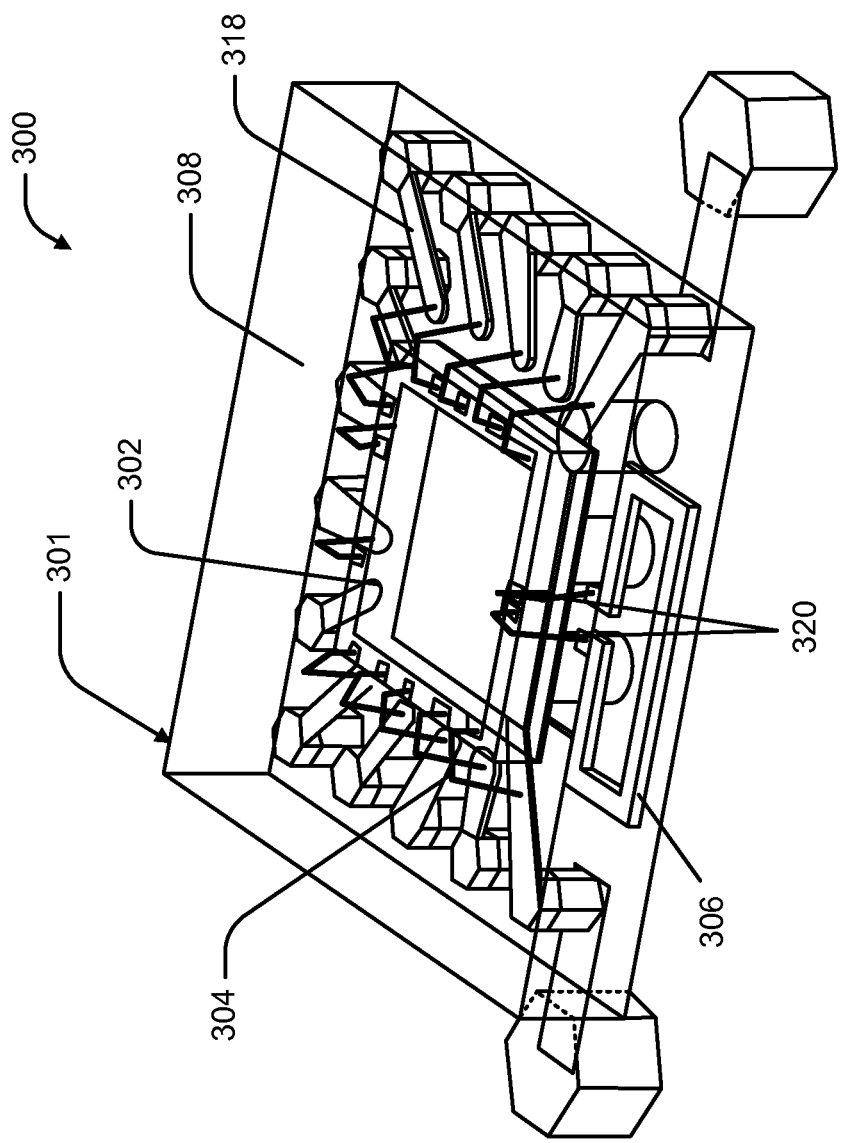
Figure 5A:
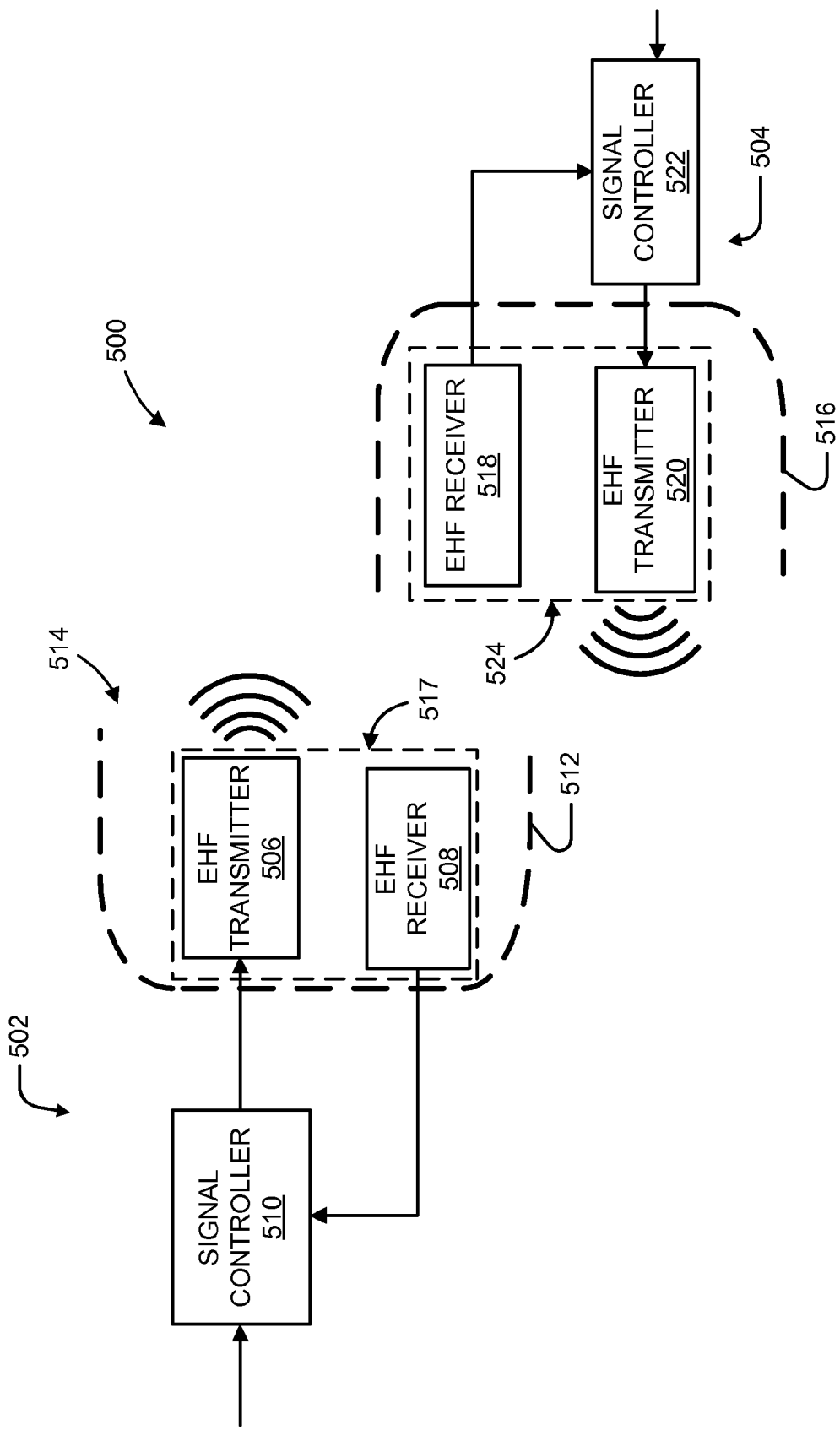
Figure 5B:
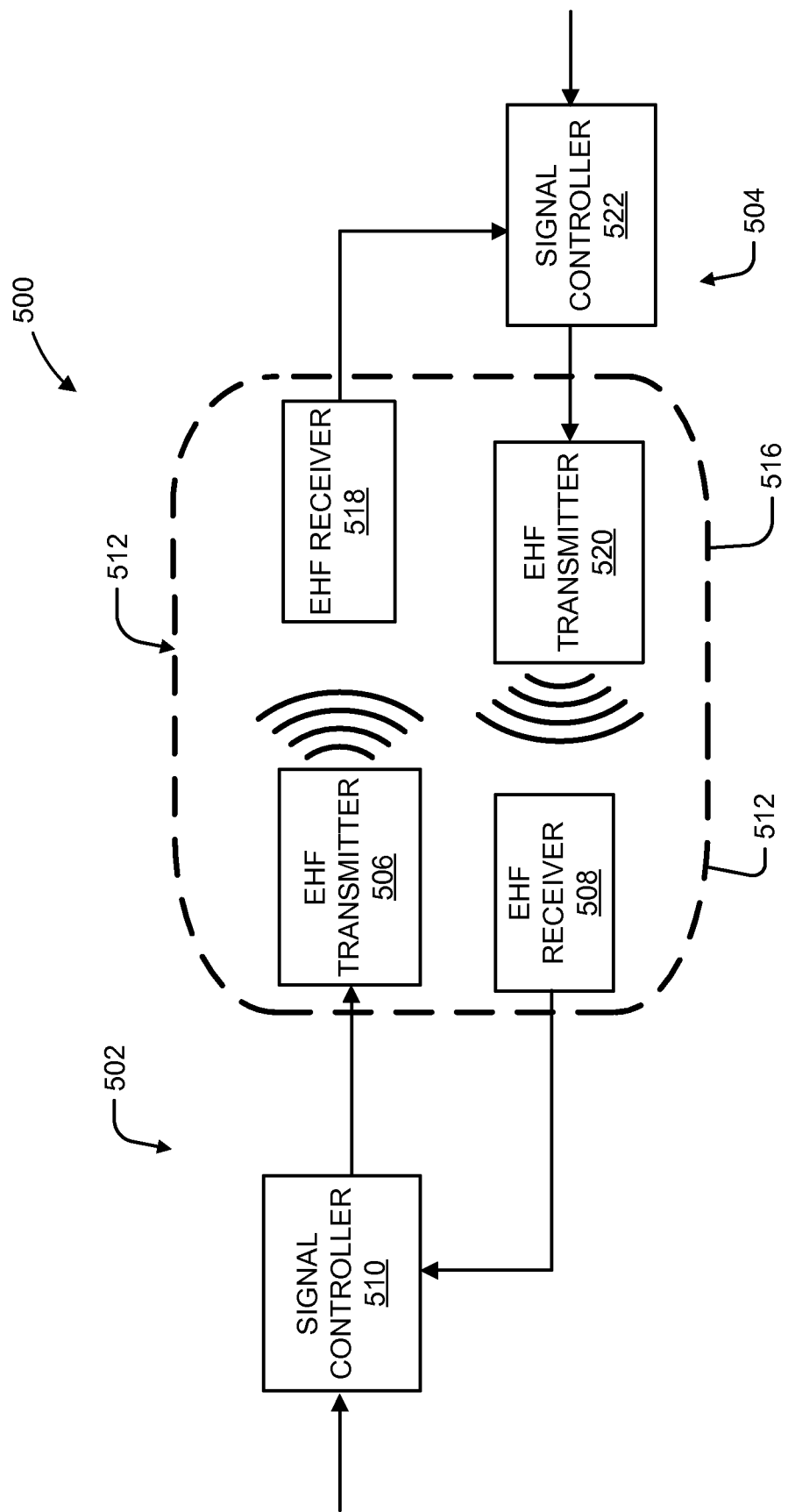
Figure 6:
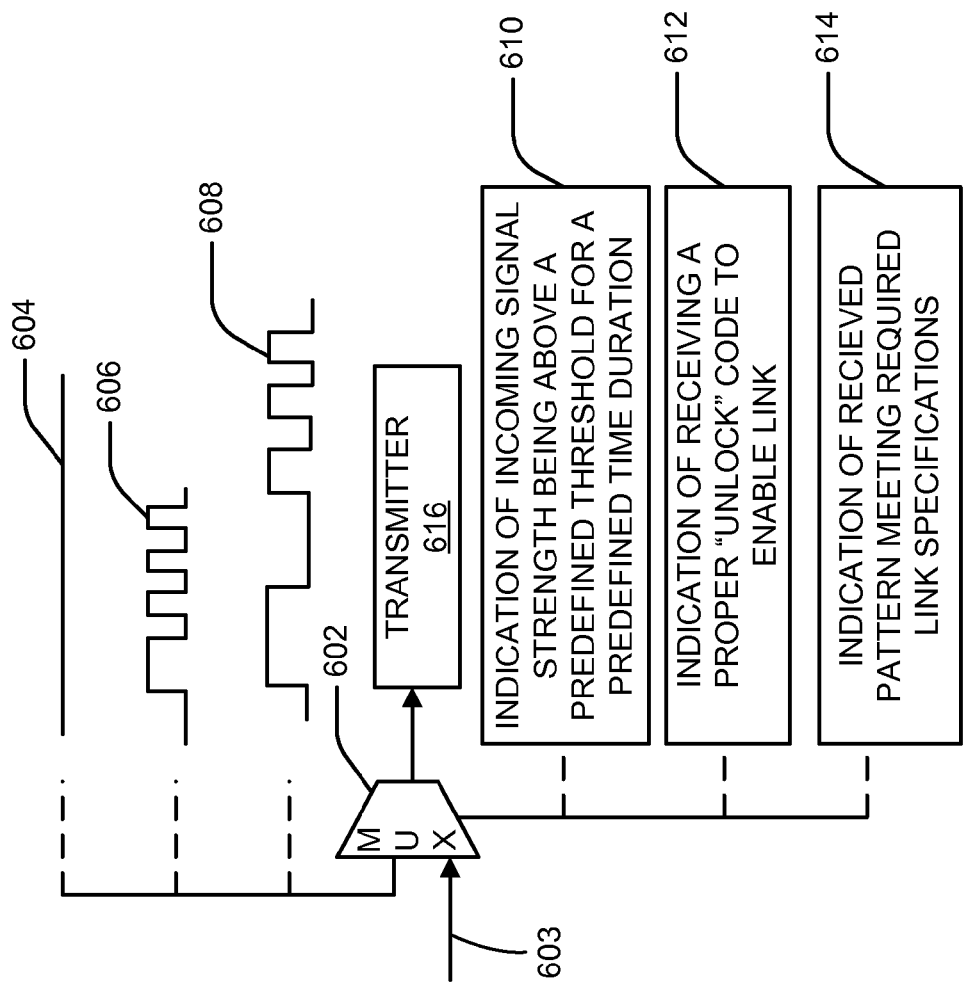
Figure 7:
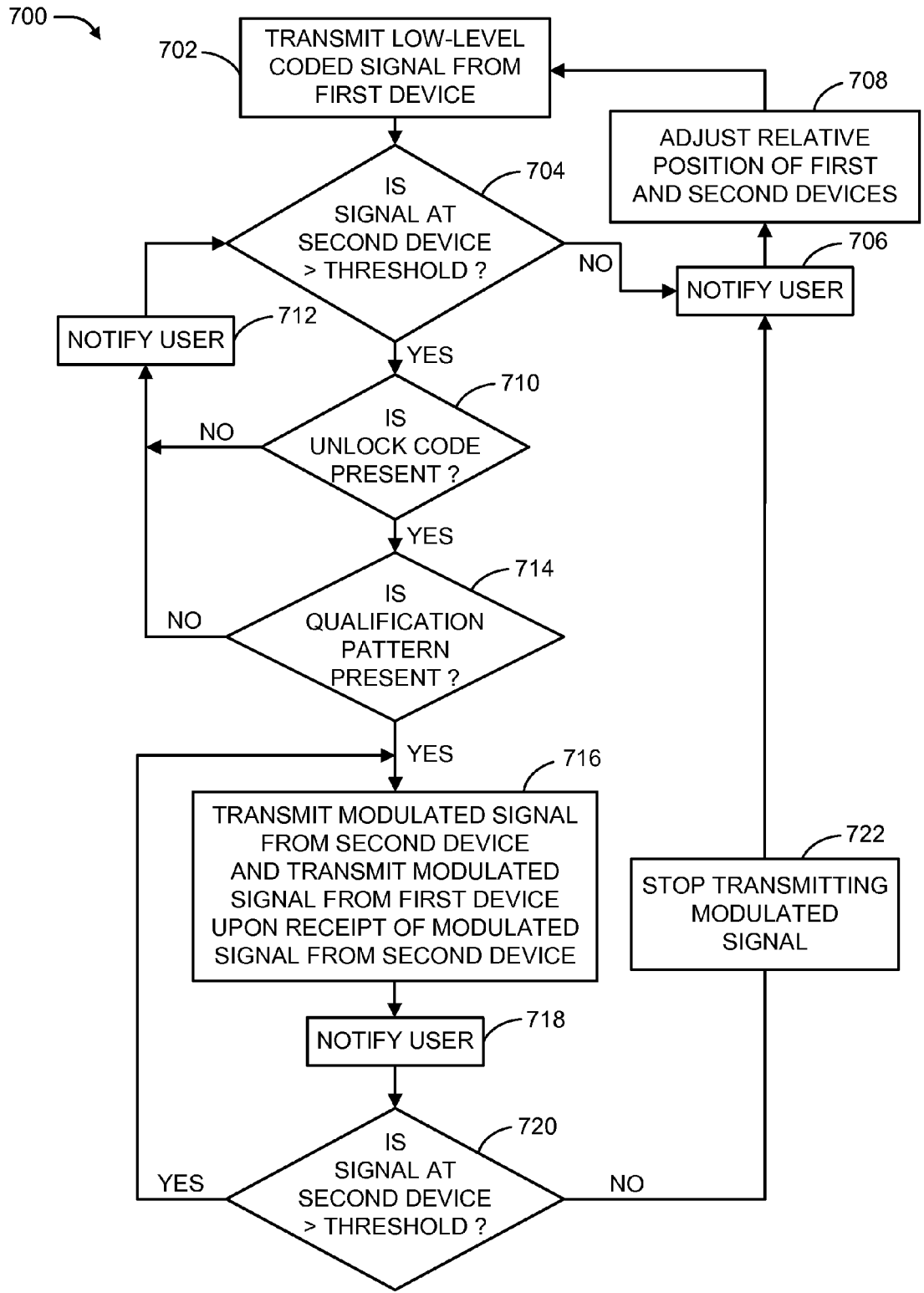

Having thus described communication between devices in general terms, reference is now made to the accompanying drawings, which are not necessarily drawn to scale, and wherein:

FIG. 1 illustrates a various embodiments of a communication system;

FIG. 2 is a side view of a first example of an EHF communication unit useable in the system of FIG. 1;

FIG. 3 is an isometric view of a second example of an EHF communication unit;

FIGS. 4A-4B depict two graphs of representative emissions spectra associated with an unmodulated signal and a modulated signal;

FIGS. 5A-5B are schematic illustrations showing a first device and a second device configured to reduce electromagnetic emissions;

FIG. 6 is a schematic illustration of an exemplary multiplexer circuit that may be used in a signal controller; and FIG. 7 is a flow chart illustrating an example of a method for communicating between the first device and the second device while reducing the production of electromagnetic emissions.

Figure 8:
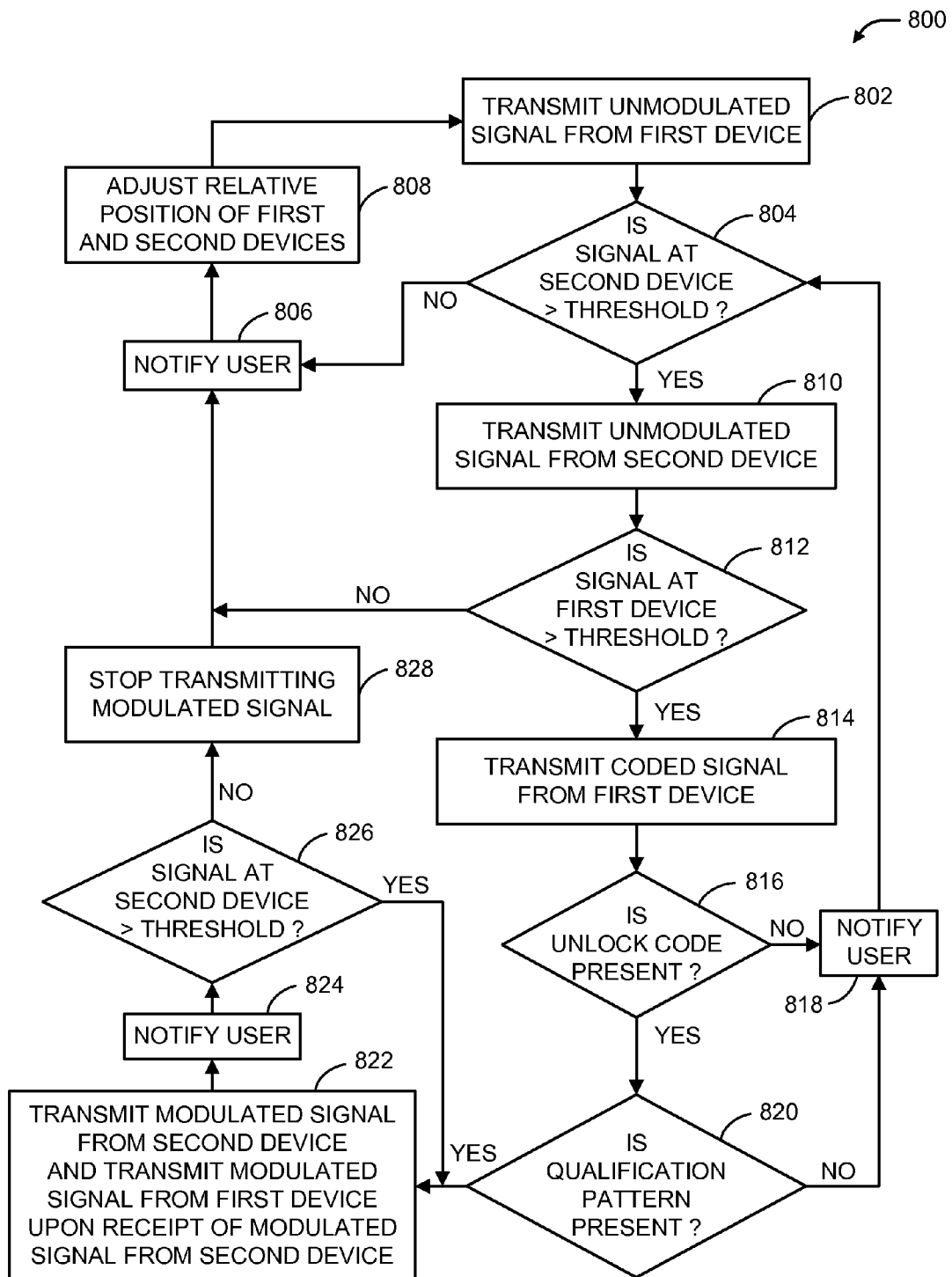

FIG. 8 is a flow chart illustrating another example of a method for communicating between the first device and the second device while reducing the production of electromagnetic emissions.

DETAILED DESCRIPTION

Illustrative embodiments are now described more fully hereinafter with reference to the accompanying drawings, in which representative examples are shown. Indeed, the disclosed communication system and method may be embodied in many different forms and should not be construed as limited to the embodiments set forth herein. Like numbers refer to like elements throughout.

In today's society and ubiquitous computing environment, high-bandwidth modular and portable electronic devices are being used increasingly. Security and stability of communication between and within these devices is important to their operation. In order to provide improved secure high-bandwidth communications, the unique capabilities of wireless communication between electronic devices and between subcircuits within each device may be utilized in innovative and useful arrangements.

Such communication may occur between radio frequency communication units, and communication at very close distances may be achieved using EHF frequencies (typically, 30-300 GHz) in an EHF communication unit. An example of an EHF communications unit is an EHF comm-link chip. Throughout this disclosure, the terms comm-link chip, and comm-link chip package are used to refer to EHF antennas embedded in IC packages. Examples of such comm-link chips are described in detail in U.S. Patent Application Publication Nos. 2012/0263244; and 2012/0307932, both of which are hereby incorporated in their entireties for all purposes. Comm-link chips are an example of a communication device, also referred to as communication unit, whether or not they provide wireless communication and whether or not they operate in the EHF frequency band.

FIG. 1 illustrates a communication system 100. As shown, system 100 may include a first device 102 configured to couple to a second device 104. The first device 102 may be configured to communicate with and/or connect to the second device 104 and vice versa. Further, the first device 102 and the second device 104 can be electronic devices capable of connecting and communicating with each other. The first device 102 may include an electromagnetic shield portion 106, an EHF communication unit 108, a signal controller 110, and an EHF communication unit 112. Similarly, the second device 104 may include an electromagnetic shield portion 114, an EHF communication unit 116, a signal controller 118, and an EHF communication unit 120.

In this example, the signal controller 118 may be configured to communicate with the EHF communication unit 116 and the EHF communication unit 120 of the second device 104. Similarly, the signal controller 110 may communicate with the EHF communication unit 108 and the EHF communication unit 112 of the first device 102.

In some embodiments, each of the EHF communication unit 108, the EHF communication unit 116, the EHF communication unit 112, and the EHF communication unit 120 can be or may include an EHF transmitter and an EHF receiver. In such an example, a first or second device may include only one EHF communication unit. Further, the single or combination of two EHF communication units may be formed as a single integrated circuit and may be represented as a single communication unit or as separate communication units. The two EHF communication units 108 and 112 thus may be formed as a single communication circuit 122. Similarly, EHF communication units 116 and 120 may be formed as a single communication circuit 124. Though not shown, a person skilled in the art will appreciate that each of the first device 102 and the second device 104 may include any number of EHF communication units.

The EHF communication unit 108 may be configured for transmitting an unmodulated first electromagnetic EHF signal. As mentioned, the EHF communication unit 108 may be a receiver, transmitter, or a transceiver. The EHF communication unit 108 may transmit or receive one or more electromagnetic signals to/from the second device 104 or specifically from the EHF communication unit 116 and/or the EHF communication unit 120, using EHF near-field coupling. The shield portion 106 may surround at least a portion of the EHF communication unit 108, to provide electromagnetic shielding. Similarly, the shield portion 114 may surround at least a portion of the EHF communication unit 116. The EHF communication units 108 and 112 may be configured to communicate with the signal controller 110. Further, the EHF communication unit 112 can be a receiver, transmitter, or a transceiver. The EHF communication unit 112 may be configured to receive or transmit at least one electromagnetic EHF signal from/to other devices present in a predefined range of distance, for example within the near field. For example, the EHF communication unit 112 can receive or transmit one or more signals from/to the second device 104.

In one example, EHF communication unit 108 may be a transmitter configured to transmit an electromagnetic EHF signal, whether modulated or unmodulated, to EHF communication unit 116, which is configured as a receiver for receiving the electromagnetic EHF signal transmitted by the EHF communication unit 108. Correspondingly, EHF communication unit 120 may be a transmitter configured to transmit a modulated or unmodulated electromagnetic EHF signal to EHF communication unit 112, which is configured as a receiver for receiving the electromagnetic EHF signal transmitted by the EHF communication unit 120.

First and second devices may be configured as peers and have corresponding functionality, or they may be configured as host and client with different functionality. In one example, the signal controller 110 may perform one or more checks to authorize communication between the first device 102 and the second device 104. Further, the signal controller 110 may determine whether the first device 102 is an acceptable device when connected to the second device 104. The signal controller 110 may analyze the one or more signals received from the second device 104, such as from the EHF communication units 116 and/or 120. The signal controller of the second device 104 may analyze and/or process the electromagnetic signals received from the first device 102 or more specifically from the EHF communication unit 108.

The shield portion 106 and the shield portion 114 may be configured to effectively connect to each other, thus acting as a continuous shield portion rather than two separated shield portions, when the first device 102 and the second device 104 are aligned properly and preferably positioned proximate to or in contact with each other. Additionally, the signal controller 118 may further be configured for determining whether the shield portion 106 is in effective electrical contact with the shield portion 114, sufficiently to form a continuous shield when the first shield portion 106 and the second shield portion 114 are aligned relative to each other and preferably positioned proximate to or in contact with each other. In FIG. 1 the shield portion 106 is shown spaced apart from and in partial alignment with shield portion 114.

The first signal controller 118 may be configured for determining whether the electromagnetic EHF signal received by the second EHF communication unit indicates that the shield portion 106 and the shield portion 114 are in alignment. Further, the signal controller 118 may be configured to produce one or more modulation signals. In an embodiment, the signal controller 118 may generate a modulated electromagnetic EHF signal when the received electromagnetic EHF signal indicates that the shield portion 106 and the shield portion 114 are in alignment. In another embodiment, the signal controller 118 may disable transmission of the modulated second electromagnetic EHF signal when the received electromagnetic EHF signal indicates that the shield portion 106 and the shield portion 114 are not in alignment.

The second EHF communication unit 116 when configured as a transceiver, or the fourth EHF communication unit 120, may further be configured to transmit an unlock code to the first device 102 when the second electromagnetic EHF signal is modulated. The unlock code may include a device identifier. In an embodiment, the communication unit 112 may receive the unlock code from the EHF communication unit 116. The signal controller 118 may authorize the second device 104 based on the unlock code. In some embodiments, the EHF communication unit 108 may transmit an unlock code to the second device 104 and either the EHF communication unit 116 or the EHF communication unit 120 may receive the unlock code. The first signal controller 118 may authorize the first device 104 based on the received unlock code.

A signal controller of one of the devices may be configured to modulate an output or transmit an electromagnetic EHF signal contingent on meeting one or more predefined criteria. For example, the one or more predefined criteria may include matching at least one of a first data pattern, a first data rate, a first bit-error rate, and a first protocol of the first device 102 with a corresponding second data pattern, a second data rate, a second bit-error rate, and a second protocol of the second device 104. The one or more predefined criteria may include determining if strength of the generated electrical EHF signal is greater than a predefined threshold for a predefined time period. In an embodiment, the first signal controller 118 may determine if strength of the received electromagnetic EHF signal is greater than a predefined threshold for a predefined time duration.

In some examples, the one or more predefined criteria or determination of whether the two devices are aligned may include detecting impedance of at least one of a first antenna of the first device 102 and/or a second antenna of the second device 104. In some embodiments, the first signal controller 118 may detect impedance of at least one of the first antenna (such as antenna 206 as shown in FIG. 2 or antenna 306 shown in FIG. 3) and the second antenna. In some examples, the one or more predefined criteria may include determining and analyzing a time-of-flight for a round-trip EHF signal, i.e., for an electromagnetic EHF signal transmitted from one device to the other device and retransmitted back to the one device. The signal controller 118 may be configured to determine whether the generated electrical EHF signal indicates that the shield portion 106 and the shield portion 114 are in alignment. Further, the EHF communication unit 108 may be configured to transmit modulated signals to the second device 104 when the first device 102 and the second device 104 are in alignment.

In some embodiments, the signal controller of one of the devices may determine whether the other device is an acceptable or compatible device for communication. For example, the signal controller of one of the devices, such as signal controller 110, may determine whether an unlock code transmitted by the other device, such as transmitted by the EHF communication unit 116, is an acceptable unlock code. A signal controller may be configured to determine whether the electromagnetic EHF signal received from the other device is modulated with data formatted according to an acceptable qualification pattern.

In some embodiments, the user may move a position of at least one of the first device 102 and the second device 104 relative to each other when the generated electrical EHF signal indicates that the shield portion 106 and the shield portion 114 are not in alignment (See FIG. 5A). Further, the first device 102 and the second device 104 may be moved until the received electromagnetic EHF signal indicates that the shield portion 106 and shield portion 114 are in alignment (See FIG. 5B). The shield portion 106 and the shield portion 114 may form a continuous shield when aligned relative to each other and the shield portions are sufficiently close to each other.

The EHF communication unit 108 may transmit a modulated first electromagnetic EHF signal to the second device 104 in response to receipt by the first device 102 of a modulated second electromagnetic EHF signal from the second device 104. The first device 102 and the second device 104 may be configured such that alignment of the EHF communication unit 108 and the EHF communication unit 116 results in substantial alignment of the shield portion 106 and the shield portion 114.

The EHF communication unit 120 may be coupled to the signal controller 118 and may be configured to transmit the second electromagnetic EHF signal to the first device 102. The EHF communication unit 112 may be configured to receive the second electromagnetic EHF signal from the second device 104. The signal controller 110 may be configured to determine whether the first device 102 and the second device 104 are in alignment by assessing one or more characteristics of the second electromagnetic EHF signal transmitted by the EHF communication unit 120 and received by the EHF communication unit 112.

Each of the first EHF communication units 108, 112, 116, and 120 may include an insulating material, a chip having an integrated circuit (IC), and an antenna configured to communicate with the IC and held in a fixed location by the insulating material as shown and described in FIGS. 2 and 3. In some embodiments, the first and second devices may have contact surfaces that interlock or mate when the first and second EHF communication units are in alignment. The devices may also include one or more respective magnets to draw the devices together and/or LEDs for indicating a proper positioning between the devices.

FIG. 2 is a side view of an exemplary EHF communication circuit 200 showing a simplified view of some structural components. Communication circuit 200 may include one or more EHF communications units and may also include a signal controller as has been described for devices 102 and 104 in the communication system 100. As illustrated, the communication circuit may include an integrated circuit package 201 that includes a die 202 mounted on a connector printed circuit board (PCB) 203, a lead frame (not shown), one or more conductive connectors such as bond wires 204, a transducer such as antenna 206, and an encapsulating material 208.

The die 202 may include any suitable structure configured as a miniaturized circuit on a suitable die substrate, and is functionally equivalent to a component also referred to as a "chip" or an "integrated circuit (IC)." The die substrate may be formed using any suitable semiconductor material, such as, but not limited to, silicon. The die 202 may be mounted in electrical communication with the lead frame. The lead frame (similar to lead frame 318 of FIG. 3) may be any suitable arrangement of electrically conductive leads configured to allow one or more other circuits to operatively connect with the die 202. The leads of the lead frame may be embedded or fixed in a lead frame substrate. The lead frame substrate may be formed using any suitable insulating material configured to substantially hold the leads in a predetermined arrangement.

Further, the electrical communication between the die 202 and leads of the lead frame may be accomplished by any suitable method using conductive connectors such as, one or more bond wires 204. The bond wires 204 may be used to electrically connect points on a circuit of the die 202 with corresponding leads on the lead frame. In another embodiment, the die 202 may be inverted and conductive connectors including bumps, or die solder balls rather than bond wires 204, which may be configured in what is commonly known as a "flip chip" arrangement.

The antenna 206 may be any suitable structure configured as a transducer to convert between electrical and electromagnetic signals. The antenna 206 may be configured to operate in an EHF spectrum, and may be configured to transmit and/or receive electromagnetic signals, in other words as a transmitter, a receiver, or a transceiver. In an embodiment, the antenna 206 may be constructed as a part of the lead frame. IC package 201 may include more than one antenna 206. In another embodiment, the antenna 206 may be separate from, but operatively connected to the die 202 by any suitable method, and may be located adjacent to the die 202. For example, the antenna 206 may be connected to the die 202 using antenna bond wires (similar to 320 of FIG. 3). Alternatively, in a flip chip configuration, the antenna 206 may be connected to the die 202 without the use of the antenna bond wires (see 320). In other embodiments, the antenna 206 may be disposed on the die 202 or on the PCB 216.

The encapsulating material 208 may hold the various components of the IC package 201 in fixed relative positions. The encapsulating material 208 may be any suitable material configured to provide electrical insulation and physical protection for the electrical and electronic components of the IC package. For example, the encapsulating material 208 may be a mold compound, glass, plastic, or ceramic. The encapsulating material 208 may be formed in any suitable shape. For example, the encapsulating material 208 may be in the form of a rectangular block, encapsulating all components of the IC package except the unconnected leads of the lead frame. One or more external connections may be formed with other circuits or components. For example, external connections may include ball pads and/or external solder balls for connection to a printed circuit board.

The IC package 201 may be mounted on a connector PCB 203. The connector PCB 203 may include one or more laminated layers 212, one of which may be a PCB ground plane 210. The PCB ground plane 210 may be any suitable structure configured to provide an electrical ground to circuits and components on the IC package.

FIG. 3 is a simplified isometric view of another example of a communication circuit 300 showing some structural components. As with communication circuit 200, communication circuit 300 may include one or more EHF communications units and may also include a signal controller as has been described for devices 102 and 104 in the communication system 100. As illustrated, communication circuit 300 may include an IC package 301 that may in turn include a die 302, a lead frame 318, one or more conductive connectors such as bond wires 304, a transducer such as antenna 306, one or more antenna bond wires 320, and an encapsulating material 308. The die 302, the lead frame 318, one or more bond wires 304, the antenna 306, the antenna bond wires 320, and an encapsulating material may be functionality similar to components such as the die 202, the bond wires 204, the antenna 206, and the encapsulating material 208 of IC package 201 as described in FIG. 2. Further, communication circuit 300 may include a connector PCB similar to PCB 203, not shown).

In FIG. 3, it may be seen that the die 302 is encapsulated in encapsulating material 308, along with the bond wires 304 and 320. In this embodiment, the IC package may be mounted on the connector PCB. The connector PCB may include one or more laminated layers, one of which may be a PCB ground plane. The PCB ground plane may be any suitable structure configured to provide an electrical ground to circuits and components on the PCB of the second EHF communication unit 314.

Signal security and integrity are important when communicating between any two EHF communication units. One method for enhancing or ensuring proper signal security and integrity is to verify that a second EHF communication unit is within a predetermined range of a first EHF communication unit before or during a communication. To that end, systems and methods may be used for detecting the presence of a second EHF communication unit and/or for ensuring another device or device surface is within a certain distance. Examples of such systems and methods are described in U.S. Published Patent Application No. 2012/0319496, which is hereby incorporated in its entirety for all purposes.

Turning to FIGS. 4A-4B, amplitude versus frequency graphs of typical emissions spectra are depicted, with superimposed lines 402 representing illustrative governmental emissions limits for a given licensed band. FIG. 4A depicts a graph of typical emissions spectra 404 for an unmodulated signal(s) or a low-level modulated signal. As depicted in FIG. 4A, an unmodulated signal or a sufficiently low-level modulated signal may include a narrow band 404A of emissions that are contained within the emissions limit 402. The modulated signal may be low-level in the sense that modulation occurs at a low frequency so as to produce a low level of electromagnetic emissions.

FIG. 4B depicts a graph of typical emission spectra 406 for a signal(s) modulated at frequencies commensurate with the information content the EHF carrier is able to convey, also referred to as a high-level modulated signal. It may be seen in FIG. 4B that a high-level modulated signal may produce a frequency band 406A that is outside the licensed band. It is desirable to avoid producing emissions outside the licensed band. A graphical representation 406 shows emissions within a shielded enclosure of frequency. An emissions band 406A is of frequency spectra 406 are outside the licensed band and emissions band 406B are within the licensed band. For a communication circuit that is not shielded, then a portion of frequency spectra are outside the licensed band when a high-level modulated signal is produced. When the communication circuit is shielded, frequency band 406 represents the frequency spectra inside the shielded enclosure, and spectra 408 shows the frequency spectra outside the shielded enclosure. It is seen that when a shielded enclosure is used, the frequency spectra outside the shielded enclosure is within the emissions limits 402.

FIGS. 5A-5B are schematic illustrations of an exemplary communication system 500 showing a first device 502 relative to a second device 504 configured to avoid producing emissions outside a given band when properly aligned relative to each other. The first device 502 may include two exemplary communication units, specifically an EHF transmitter 506 and an EHF receiver 508, electrically connected to a signal controller 510. A discontinuous shield portion 512 may partly surround the EHF transmitter 506 and the EHF receiver 508. In some examples, the shield portion may also extend around signal controller 510.

For example, a portion of first device 502 may include a layer or section of material that acts to inhibit or block electromagnetic signals. This layer or section may be discontinuous in the sense that it may not form a continuous shield in every direction, but rather can include an opening or openings 514 in one or more directions along which electromagnetic EHF signals are transmitted from transmitter 506 and transmitted to receiver 508. This configuration is represented in FIG. 5A by a U-shaped cross section. As shown in the figure, the shield portion 512 (corresponding to shield portion 106) may be constructed to facilitate a mating relationship with a corresponding shield 516 (corresponding to shield portion 114) on second device 504. The shield portions 512 and 516 are discontinuous shields and may not adequately shield transmissions between the first device 502 and the second device 504 when the shield portions are not aligned. FIG. 5A shows the devices and thereby the shield portions out of alignment. Therefore, the first device and the second device may be moved until a proper alignment is established between the two devices, as shown in FIG. 5B.

The EHF transmitter 506 may be an example of the previously described EHF communication unit 108, and may be adapted to transmit selectively a modulated and an unmodulated EHF signal provided by one or more circuits in the first device 502 upstream to the signal controller 510. For example, the EHF transmitter 506 may transmit a substantially constant signal, a modulated signal, an intermittent signal, a combination of these, or any other signal capable of being transmitted in the licensed EHF band.

The EHF receiver 508 may also be an example of the previously described EHF communication unit 112, and may be adapted to receive an EHF signal and to provide that signal in electronic form to one or more circuits in the first device 502, including the signal controller 510. The signal controller 510 may determine whether an unmodulated signal received by EHF receiver 508 is adequate to enable modulation of transmitted signals. Transmitter 506 and receiver 508 may form a communication circuit 517.

The second device 504 may be similar to the first device 502, and may include an EHF receiver 518, an EHF transmitter 520, a signal controller 522, as well as shield portion 512 with similar functions and connections as the corresponding components of the first device 502. Receiver 518 and transmitter 520 may be part of a communication circuit 524. The signal controller 522 may also be configured to receive modulated or unmodulated signals from receiver 518 that are received from other devices such as, but not limited to the first device 502.

In some embodiments, the signal controller 510 of the first device 502 may determine whether the second device 504 is an acceptable or compatible device. In an embodiment, the signal controller 510 may determine whether the second device 504 is an acceptable device based on an unlock code. The unlock code may be a device identifier that can include alphanumeric data, symbols, or a combination of these. The second signal controller may determine whether the unlock code transmitted by the EHF transmitter 520 is an acceptable unlock code. The second signal controller may be configured to determine whether an electromagnetic EHF signal received by receiver 508 is modulated based on the one or more predefined criteria. For example, the signal controller may be configured to determine whether the received electromagnetic EHF signal is modulated with data formatted according to an acceptable qualification pattern.

Devices 502 and 504 may be changed or moved relative to each other when an electrical EHF signal generated from a received electromagnetic EHF signal indicates that shield portions 512 and 516 are not in alignment. The devices may be moved until the generated electrical EHF signal indicates that shield 512 and shield 516 are in alignment. When the devices are in alignment, the shield portions 512 and 516 may form a continuous shield 524 that reduces the amount of emissions, as was described with reference to FIGS. 3A and 3B.

The EHF transmitter 506 may transmit a modulated electromagnetic EHF signal to the second device 504 in response to receipt by the first device 502 of a modulated electromagnetic EHF signal from the second device 504. The devices 502 and 504 may be configured such that alignment of the EHF transmitter 506 and the EHF receiver 518 results in substantial alignment of shield portions 512 and 516

The signal controller 510 may be configured to determine whether the devices 502 and 504 are in alignment by assessing one or more characteristics of an electromagnetic EHF signal transmitted by EHF transmitter 520 and received by EHF receiver 508.

The alignment of devices 502 and 504 refers to axial and proximal alignment of the EHF transmitter/receiver pairs, namely EHF transmitter 506 with EHF receiver 518 as well as EHF transmitter 520 with EHF receiver 508. The proper alignment of these pairs may allow EHF signal communication between at least one of the pairs of transmitter and receiver and thus communication between the two devices. The shield portions 512 and 516 of the two devices, respectively, may also be configured to ensure that the shield portions are aligned and form a continuous shield 524 when the transmitter/receiver pairs are in proper alignment. Further, the shield portions may be configured to be in electrical contact when they are aligned relative to each other.

As mentioned previously, the discontinuous shield portions may form a continuous shield 524 around the transmitter/receiver pairs as shown in FIG. 5B when the shield portions are in an aligned and mated position. The continuous shield 524 around the EHF transmitter/receiver pairs may block spurious emissions sufficiently to comply with regulation emission limits. Thus, when the devices are properly aligned, the EHF transmitters may transmit modulated EHF signals or carriers without violating emission limits.

Further as has been mentioned, one or both of the devices may determine whether the other device is an acceptable device based on one or more criteria. When the devices are properly aligned, the respective signal controller may determine that the received signal is properly qualified and may enable modulation and accordingly produce a modulated EHF signal accordingly. Thereafter, the modulated EHF signal may be transmitted by the respective EHF transmitter to the counterpart receiver.

In an embodiment, the signal controller and EHF communication unit(s) in one or both of the devices may be adapted to provide verification of transmitter/receiver alignment. This may in turn provide a corresponding verification that physical shielding is also in proper alignment. This may allow the device to avoid transmission of modulated signals except when the shielding is in place to prevent excessive signals from being broadcast outside the licensed band. Taking device 502 as an illustrative example, this may be accomplished by configuring the signal controller 510 to output an unmodulated signal stream to transmitter 506 unless the EHF receiver 508 receives and passes along an indication of receipt of a qualified signal transmission from device 504. In this example, that signal may be transmitted by EHF transmitter 520. A transmitted signal may be checked to determine whether it meets certain predetermined criteria such as transmission strength or whether it includes one or more pieces of certain encoded information pertinent to the qualification determination.

In response to determining that a received transmission is qualified, the signal controller 510 may select a modulated signal stream to be passed to EHF transmitter 506 and transmitted. Likewise, signal controller 522 of device 504 may be configured to look for a qualified signal from device 502, and may only transmit a modulated signal via EHF transmitter 520 in response to that qualified signal. As previously described, this mutual arrangement results in the prevention of modulated transmissions unless the transmitter/receiver pairs are aligned and the respective devices transmit in compliance with the qualification criteria.

The signal controller 522 and the signal controller 510 may be any suitable circuit configured to select between two or more signals based on one or more inputs. In the embodiment shown in FIGS. 5A and 5B, a signal controller may include a multiplexer circuit (MUX) 602 as shown in FIG. 6. As discussed with reference to FIGS. 5A and 5B, the multiplexer circuit 602 may be adapted to receive inputs or signals on an input 603, such as signals from one or more signal generating circuits (not shown). The signal generating circuits may produce a modulating data baseband signal (not shown). The multiplexer circuit may further receive different types of input signals from which one is selected for transmitting to the associated transmitter, such as EHF transmitter 506 for signal controller 510. These signals may include an exemplary pilot-tone signal input 604 that is an unmodulated carrier tone that produces emissions within a license-free band without relying on an electromagnetic shield. Logic 1 may be produced in signal input 614 to provide a simple unmodulated signal or carrier 604 received by the multiplexer circuit. A data sequence 606 may indicate an unlock code for transmitting to a second device, such as second device 504. Another data sequence 608 may indicate a link enumeration or a qualification sequence or qualification pattern for transmitting to the second device.

As discussed with reference to FIGS. 1, and 5A and 5B, the signal controller 522 may determine whether one or more criteria are satisfied before sending the first device a modulated data signal. A modulated output signal may be produced when the one or more criteria are satisfied. In an embodiment, the multiplexer circuit 602 may also receive indication signals 610, 612, and 614 that result from a determination of the characteristics of signals received from the second device, such as device 504.

In an embodiment, criteria determination circuits of the signal controller may provide the indication signals 610, 612, and 614 to the multiplexer 602. Indication signal 610 may provide an indication as to whether a received EHF electromagnetic signal strength is above a predefined threshold for a predefined time duration. Indication signal 612 may provide an indication as to whether a received EHF electromagnetic signal includes a proper unlock code. Indication signal 614 may provide an indication as to whether a received pattern meets a required link specification.

FIG. 7 is a flow chart illustrating an example of a method 700 for allowing communication between the first device 102 (or 502) and the second device 104 (or 504) while avoiding or reducing the production of electromagnetic emissions that are outside a licensed band. As discussed with reference to FIG. 1, the first device 102 (502) may include the EHF communication unit 108 (transmitter 506), the shield portion 106 (or 512), the signal controller 110 (or 510), and in some examples the EHF communication unit 112 (receiver 508). Similarly, the second device 104 (504) may include the shield portion 114 (516), the EHF communication unit 116 (receiver 518), the signal controller 118 (522), and in some examples the EHF communication unit 120 (transmitter 520). The device 102 (502) and the device 104 (504) may communicate with each other by transmitting and/or receiving electromagnetic signals.

At step 702, a low-level modulated signal or carrier may be transmitted by the first device 102 (502). The modulated signal is being transmitted initially without confirmation that the two devices are in alignment. As mentioned, the modulated signal may be low-level in the sense that modulation occurs at a low frequency so as to produce a low level of electromagnetic emissions. In this example, the EHF communication unit 108 (506) may transmit the modulated signal to the device 104 (504).

At step 704, it is determined whether the strength of the low-level modulated signal received by the receiver (such as, the EHF communication unit or receiver 116 or 518, or more generally at the second device 104 or 504) is over a predetermined threshold. In other words, the amplitude of a signal may be compared with a predefined minimum signal amplitude (or predefined threshold) to determine whether the signal meets the predefined threshold that indicates proper alignment of a transmitter/receiver pair. If the predefined threshold is not met, then the user may be notified at step 706, such as by a display, sound, light, or other sensible indicator. This may then prompt the user to adjust the relative position of the devices 102 (502) and 104 (504) at step 708, and the signal strength checked again at step 704 while the first device continues to transmit the low-level modulated signal at step 702. Since a user may move one or both of the devices, it is sufficient that the positions of the two devices relative to each other are moved. The second device may then continually monitor the signal strength and provide an indication as to whether alignment exists or continues to exist.

If at step 704 the signal strength is determined to be greater than the predefined threshold, then step 710 is performed, and if not, the signal strength is monitored while a user continues to perform step 708 by further moving the devices. In some examples, the second device may also transmit an unmodulated signal or a low-level modulated signal back to the first device, upon receipt of which the first device makes determinations of the propriety of the second device, similar to those described, for sending data signals to the second device.

At step 710, the content of the signal may be analyzed to determine whether a desired, predefined unlock code is present. The unlock code would be data in the received low-level modulated signal. If at step 710 a desired unlock code is not present, then a user is notified at step 712, and step 704 is repeated and the signal is analyzed again.

It is also possible that a spurious signal, or a signal from an unsupported transmitter, may be present, and further adjustment of the relative positions of the first device 102 (502) and the second device 104 (504) may be ineffective to meet the above-identified tests without removing the source of the spurious signal. If the predefined unlock code is present in the signal, At step 714, the signal may be further analyzed to determine whether an acceptable qualification pattern is present. If a proper qualification pattern is not present, then the user is notified and step 712 and the analysis returns to step 704 to continue checking the received signal for compliance with these tests. In some embodiments, when the proper qualification pattern is not present then adjustment of the relative device positions may or may not be needed.

Note that steps 704, 710, and/or 714 constitute aspects of qualifying the first device, and may be performed in a different order or even in parallel. It is also noted that different, fewer or additional criteria may be used to qualify the first device. For example, antenna impedance may be detected, or time-of-flight for a round-trip signal may be analyzed to determine whether the devices are sufficiently close, as is disclosed in U.S. Published Patent Application No. 2012/0319496, which reference is incorporated herein by reference.

If all criteria are satisfied, then at step 716 a modulated signal may be transmitted from the second device to the first device. Thereafter at step 718, a user may also be notified of proper alignment (i.e., that all criteria are met) by a suitable indicator. For example, an LED may be lit, an audible alert may be sounded, and/or a vibration may be created to notify the user about proper alignment of the two devices. The proper alignment of the first device 102 (502) and the second device 104 (504) may reduce or avoid the production of undesired emissions that are outside a licensed band by the limitation of transmitted emissions until formation of the continuous shield formed by the shield portions of the two devices is confirmed. Although not specifically shown, the first device may begin transmitting a low-level or high-level modulated first electromagnetic EHF signal to the second device in response to receipt by the first device of a second electromagnetic EHF signal from the second device that is modulated at a corresponding low or high level.

As discussed above, during operation of the second device, the received signal is continually monitored at step 720 to confirm that suitable alignment continues to exist. So long as the signal strength (or other determinant) is sufficient, the second device continues to transmit modulated signals to the first device. If at any time the signal strength diminishes below the threshold, the transmission of the modulated signal is terminated at step 722, the user is notified at step 706 for adjustment of the two devices by the user at step 708, and the process of linking the two devices is re-initiated at step 702.

FIG. 8 is a flow chart illustrating another example of a method 800 for allowing communication between the first device 102 (or 502) and the second device 104 (or 504) while avoiding or reducing the production of electromagnetic emissions that are outside a licensed band. In this example, at step 802, an unmodulated signal or carrier may be transmitted by the first device 102 (502). The unmodulated signal is being transmitted initially without confirmation that the two devices are in alignment because it inherently produces low levels of emissions even when the devices do not form an electromagnetic shield. In this example, the EHF communication unit 108 (506) may transmit the modulated signal to the device 104 (504).

At step 804, it is determined whether the strength of the unmodulated signal received by the receiver (such as, the EHF communication unit or receiver 116 or 518, or more generally at the second device 104 or 504) is over a predetermined threshold. If the predefined threshold is not met, then the user may be notified at step 806. This may then prompt the user to adjust the relative position of the devices 102 (502) and 104 (504) at step 808, and the signal strength checked again at step 804 while the first device continues to transmit the unmodulated signal at step 802.

Since a user may move one or both of the devices, it is sufficient that the positions of the two devices are moved relative to each other. The second device may then continually monitor the signal strength and provide an indication as to whether alignment exists or continues to exist based on the signal strength. As also mentioned above, other criteria may be examined for determining alignment, such as antenna impedance or time-of-flight for a round-trip signal.

If at step 804 the strength of the signal received at the second device is determined not to be greater than the predefined threshold, the second device continues to monitor the received signal strength at step 804 while a user continues to move the devices at step 708. If the received signal strength is determined to be greater than the predefined threshold, then the second device may in turn transmit an unmodulated signal or even a low-level modulated signal to the first device at step 810 for use by the first device in determining whether it is appropriate to send data to the second device using similar steps.

Then, at step 812 a determination may be made at the first device as to whether the signal received from the second device is greater than a predefined threshold, and if not, the signal strength continues to be monitored while a user continues to perform step 708 by further moving the devices. If the signal received from the second device is greater than a predefined threshold, the first device may then begin transmitting a signal modulated with an unlock code and with a predefined qualification pattern at step 814. This signal may be a low-level modulated signal or it may be a high-level modulated signal.

After the second device has determined that the received signal has sufficient strength, at step 816, the content of the signal may be analyzed to determine whether a desired, predefined unlock code is present in the modulated signal received from the first device. If at step 816 a desired unlock code is not present, then a user is notified at step 818, and step 804 is repeated and the signal is analyzed again.

If the predefined unlock code is present in the signal, at step 816, the signal may be further analyzed at step 820 to determine whether an acceptable qualification pattern is present. If a proper qualification pattern is not present, then the user is notified at step 818 and the analysis returns to step 804 to continue checking the received signal for compliance with these tests. In some embodiments, when the proper qualification pattern is not present then adjustment of the relative device positions may or may not be needed.

If a required qualification pattern is present, then at step 822 the second device transmits a modulated signal containing data, including control and further handshake protocols to establish communication with the first device. A user may also be notified at step 824 with an indication that the two devices are aligned and communication is taking place. As in method 700, the first device may begin transmitting a high-level modulated first electromagnetic EHF signal to the second device in response to receipt by the first device of a high-level modulated second electromagnetic EHF signal from the second device.

During operation of the second device, the received signal is continually monitored at step 826 to confirm that suitable alignment continues to exist. So long as the signal strength (or other determinant) is sufficient, the second device continues to transmit modulated signals to the first device. If at any time the signal strength diminishes below the threshold, the transmission of the modulated signal is terminated at step 828, the user is notified at step 806 for adjustment of the two devices by the user at step 808, and the process of linking the two devices is re-initiated at step 802.

Again, the steps shown for qualifying the first device for communication with the second device are exemplary, and may be performed in a different order or even in parallel. Also, different, fewer or additional criteria may be used to qualify the first device for communication.

If all criteria are satisfied, then at step 716 a modulated signal may be transmitted from the second device to the first device. Thereafter at step 718, a user may also be notified of proper alignment (i.e., that all criteria are met) by a suitable indicator. For example, an LED may be lit, an audible alert may be sounded, and/or a vibration may be created to notify the user about proper alignment of the two devices. As discussed above, the proper alignment of the first device 102 (502) and the second device 104 (504) may reduce or avoid the production of undesired emissions that are outside a licensed band by the limitation of transmitted emissions until formation of the continuous shield formed by the shield portions of the two devices is confirmed.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

What is claimed is:

1. A method for managing a communication link between a first device and a second device, the method comprising:
   receiving by the second device a first electromagnetic EHF signal transmitted by the first device, the first device comprising a first transmitter and a first receiver partially enclosed by a first shield portion, and the second device comprising a second transmitter and a second receiver partially enclosed by a second shield portion;
   determining by the second device whether the received first electromagnetic EHF signal indicates that the first shield portion of the first device and the second shield portion of the second device are in alignment; and
   in response to a determination that the received first electromagnetic EHF signal indicates that the first shield portion and the second shield portion are in alignment, enabling by the second device transmission of a modulated second electromagnetic EHF signal by the second device.

2. The method of claim 1 wherein determining whether the received first electromagnetic EHF signal indicates that a first shield portion of the first device and a second shield portion of the second device are in alignment includes determining whether the first shield portion and second shield portion are aligned proximate to each other.

3. The method of claim 1 further comprising receiving by the second device a modulated third electromagnetic EHF signal transmitted by the first device in response to receipt by the first device of the modulated second electromagnetic EHF signal from the second device.

4. The method of claim 1 further comprising transmitting by the second device an unmodulated or low-level modulated second electromagnetic EHF signal to the first device in response to receipt by the second device of the first electromagnetic EHF signal.

5. The method of claim 1 wherein determining whether the received first electromagnetic EHF signal indicates that a first shield portion of the first device and a second shield portion of the second device are in alignment; consists of determining by the second device whether the received first electromagnetic EHF signal is modulated with a high level of modulation.

6. The method of claim 1 further comprising transmitting by the second device an unmodulated or low-level modulated second electromagnetic EHF signal to the first device prior to receipt by the second device of the first electromagnetic EHF signal.

7. The method of claim 1 wherein the modulated second electromagnetic EHF signal has electromagnetic emissions within predefined emission limits when the first shield portion and the second shield portion are in alignment and has electromagnetic emissions that exceed the predefined emission limits when the first shield portion and the second shield portion are not in alignment.

8. The method of claim 1 wherein the modulated second electromagnetic EHF signal is a high-level modulated signal.

9. The method of claim 1 further comprising:
after the enabling of transmission of a modulated second electromagnetic EHF signal by the second device, continuing to receive by the second device the first electromagnetic EHF signal transmitted by the first device;
determining by the second device whether the received continuing first electromagnetic EHF signal indicates that the first shield portion and the second shield portion are in alignment; and
in response to a determination that the received continuing first electromagnetic EHF signal indicates that the first shield portion and the second shield portion are not in alignment, disabling by the second device transmission of the modulated second electromagnetic EHF signal by the second device.

10. A method for managing a communication link between a first device and a second device, the method comprising:
receiving by the second device a first electromagnetic EHF signal transmitted by the first device, the first device comprising a first transmitter and a first receiver partially enclosed by a first shield portion, and the second device comprising a second transmitter and a second receiver partially enclosed by a second shield portion;
determining by the second device whether the received first electromagnetic EHF signal indicates that the first shield portion of the first device and the second shield portion of the second device are in alignment; and
in response to a determination that the received first electromagnetic EHF signal indicates that the first shield portion and the second shield portion are not in alignment, disabling by the second device transmission of a modulated second electromagnetic EHF signal by the second device.

* * * * *